United States Patent [19]
Krishnamoorthy

[11] Patent Number: 6,067,307
[45] Date of Patent: May 23, 2000

[54] VERTICAL CAVITY SURFACE EMITTING LASER DRIVING CIRCUIT

[75] Inventor: Ashok V. Krishnamoorthy, Middletown, N.J.

[73] Assignee: Lucent Technologies Inc., Murray Hill, N.J.

[21] Appl. No.: 09/096,802

[22] Filed: Jun. 12, 1998

[51] Int. Cl.[7] ................................................ H01S 3/00
[52] U.S. Cl. .......................... 372/38; 372/26; 372/28; 372/43; 372/50; 372/92; 372/98
[58] Field of Search ................. 372/26, 28, 38, 372/20, 39, 43, 50, 92, 98

[56] References Cited

U.S. PATENT DOCUMENTS

| | | | |
|---|---|---|---|
| 5,684,308 | 11/1997 | Lovejoy et al. | 25/184 |
| 5,764,667 | 6/1998 | Luque | 372/38 |
| 5,774,614 | 6/1998 | Gilliland et al. | 385/88 |
| 5,796,767 | 8/1998 | Aizawa | 372/38 |
| 5,883,910 | 3/1999 | Link | 372/38 |
| 5,966,394 | 10/1999 | Surr et al. | 372/34 |
| 6,005,262 | 12/1999 | Cunningham et al. | 257/84 |

OTHER PUBLICATIONS

"GaAs MQW Modulators Integrated With Silicon CMOS"; IEEE Photonics Technology Letter, vol. 7, No. 4, p. 360–362, 1995; K. Goossen, etal.

"3–D intergration of MQW Modulators Over Active Sub–Micron CMOS Circuits: 375 Mb/s Transimpedance Receiver–Transmitter Circuit"; IEEE Photonics Technology Letters, vol. 7, No. 11, p. 1288–1290, Nov. 1995; A. V. Krishnamoorthy etal.

"A Low–Power 1–Gb/s CMOS Laser Driver For A Zero–Bias Modulated Optical Transmitter"; IEEE Photonics Technology Letters, vol. 9, No. 7, p. 997–999, Jul. 1997; L. Chen etal.

"High Speed Operation Of Hybrid CMOS Vertical Cavity Surface Emitting Laser Array"; Electronics Letters, vol. 27, No. 13, p. 1189–1191; 20th Jun. 1991.

*Primary Examiner*—Brian Healy
*Attorney, Agent, or Firm*—J. J. Brosemer

[57] ABSTRACT

A current driver circuit for a vertical cavity surface emitting laser (VCSEL), flip-chip bonded to a CMOS device. In a preferred embodiment, the circuit includes only two transistors. Specifically, a P-channel metal-oxide semiconductor (PMOS) source supplies a current under the control of a tuning voltage (Vtune) while an N-channel metal-oxide semiconductor (NMOS) transistor acts as a high-speed current shunt that modulates the current flowing through the VCSEL, and hence its emitted power.

11 Claims, 2 Drawing Sheets

VERTICAL CAVITY SURFACE EMITTING LASER DRIVING CIRCUIT

FIELD OF THE INVENTION

The present invention relates generally to the field of optical communications and in particular to a driving circuit for a vertical cavity surface emitting laser.

BACKGROUND OF THE INVENTION

Optical interconnections are widely used to provide reliable interconnections between electronic components. Of particular importance, surface-normal optical interconnections have been shown to provide high-performance optical interconnects directly to the densest level of integration available with electronics, namely complementary, metal-oxide-semiconductor, very-large-scale integrated circuitry (CMOS VLSI).

Accordingly, the prior art has previously developed surface-normal optoelectronic-VLSI circuits based upon flip-chip attachment of GaAs multiple quantum well (MQW) light-detectors and light-modulators onto a pre-fabricated silicon CMOS integrated circuit. (See, e.g., Goossen, et al., "GaAs MQW modulators integrated with silicon CMOS," *IEEE Photonics Technology Letter*, Vol. 7, No. 4, p. 360–62, 1995; Krishnamoorthy et al., "3-D integration of MQW modulators over active sub-micron CMOS circuits: 375 Mb/s transimpedance receiver-transmitter circuit," *IEEE Photonics Technology Letters*, vol. 7, no. 11, pp. 1288–1290, November 1995).

Optoelectronic-VLSI circuits such as those shown in the prior art typically incorporate arrays of receiver and transmitter circuits. For a number of reasons, it may be advantageous to replace the modulator-based transmitters described in the prior art with Vertical Cavity Surface Emitting Lasers (VCSELs). Inasmuch as the VCSEL depends upon an injection of current into a lasing cavity, a transmitter circuit for the VCSEL must modulate the injected current. Consequently, a continuing need exists in the art for high-performance, power-efficient circuits for driving the VCSELs.

SUMMARY OF THE INVENTION

I have developed a current driver circuit for a VCSEL, flip-chip bonded to a CMOS device. In a preferred embodiment, the circuit advantageously includes only two transistors. Specifically, a P-channel metal-oxide semiconductor (PMOS) source supplies a current under the control of a tuning voltage (Vtune) while an N-channel metal-oxide semiconductor (NMOS) transistor acts as a high-speed current shunt that modulates the current flowing through the VCSEL, and hence its emitted power.

In accordance with the present invention, the dimensions of the circuits and tuning voltage can be chosen such that the current flowing through a given VCSEL is always above a lasing threshold current for that given VCSEL.

Further features and advantages of the present invention, as well as the structure and operation of various embodiments of the present invention are described in detail below with reference to the accompanying drawing.

DETAILED DESCRIPTION OF THE INVENTION

Figure 1:
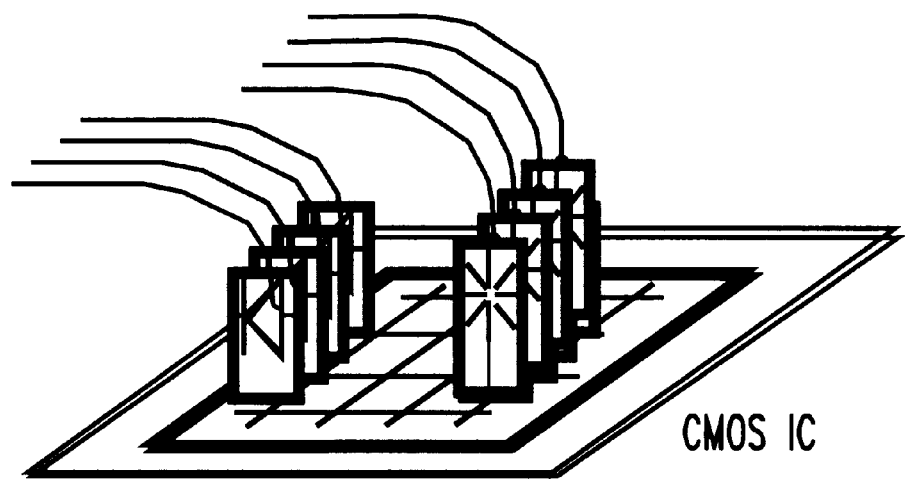
FIG. 1 is a schematic showing an integrated optoelectronic-VLSI chip having VCSELs and detectors directly bonded to a CMOS integrated circuit.

With reference to FIG. 1, there is a schematic illustrating an exemplary, integrated optoelectronic device in which VCSELs and detectors are directly bonded to a CMOS IC. Not shown in this schematic, but whose presence are readily apparent to those skilled in the art, are the driver circuits for the VCSELs and the detectors together with other circuits used for processing or switching data. As can be appreciated, such integrated packaging of the device significantly reduces parasitic electrical characteristics—common with non-integrated devices, thereby permitting the VCSEL to operate at higher rates with improved power characteristics.

Important characteristics of a VCSEL driver circuit include stable current output when not being modulated and the ability for high-speed modulation under CMOS logic level control. Additionally, for high-density, low-cost devices such as that shown in FIG. 1, low area and low power dissipation are desirable characteristics as well.

Figure 2:
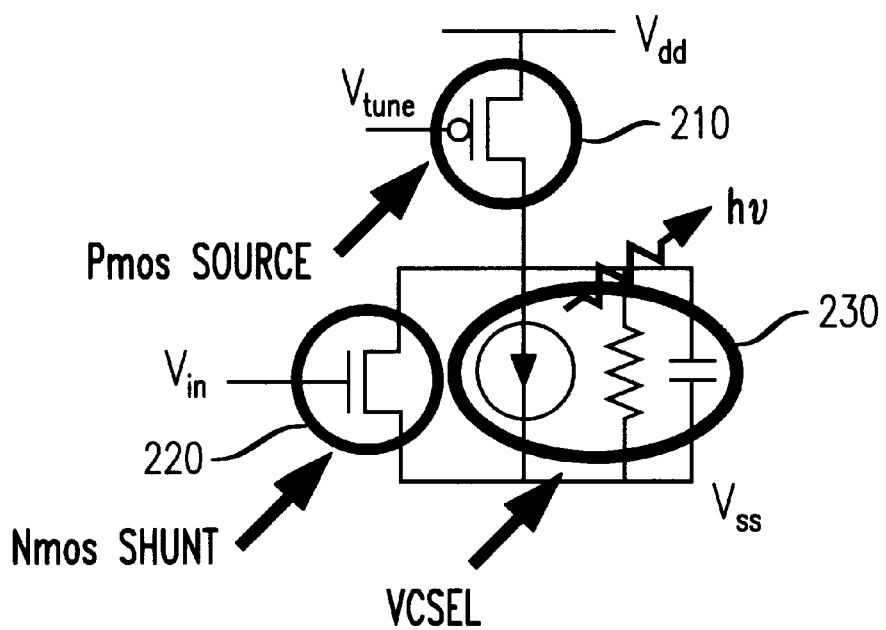
FIG. 2 is a schematic of a VCSEL driver circuit according to the present invention.

FIG. 2 illustrates the basic principle of my laser driver circuit. Broadly speaking, the invention is embodied by two transistors and a VCSEL. Specifically, a PMOS source transistor 210 supplies a current to VCSEL 230 upon the application of a tuning voltage, $V_{tune}$ applied to the PMOS source transistor 210. An NMOS shunt transistor 220, electrically connected in parallel with the VCSEL 230, operates as a current shunt upon the application of voltage $V_{in}$ to the NMOS shunt transistor 220, thereby modulating the current flowing through the VCSEL 230 and hence its emitted power.

As those skilled in the art will recognize, the dimensions of the circuits and the tuning voltage can be chosen such that the current flowing through a particular VCSEL is always above a lasing threshold current for that VCSEL. Additionally, the precise dimensions may be chosen according to the particular VCSEL specification(s), e.g., its threshold current, slope efficiency, capacitance, series resistance, and differential resistance.

Figure 3:
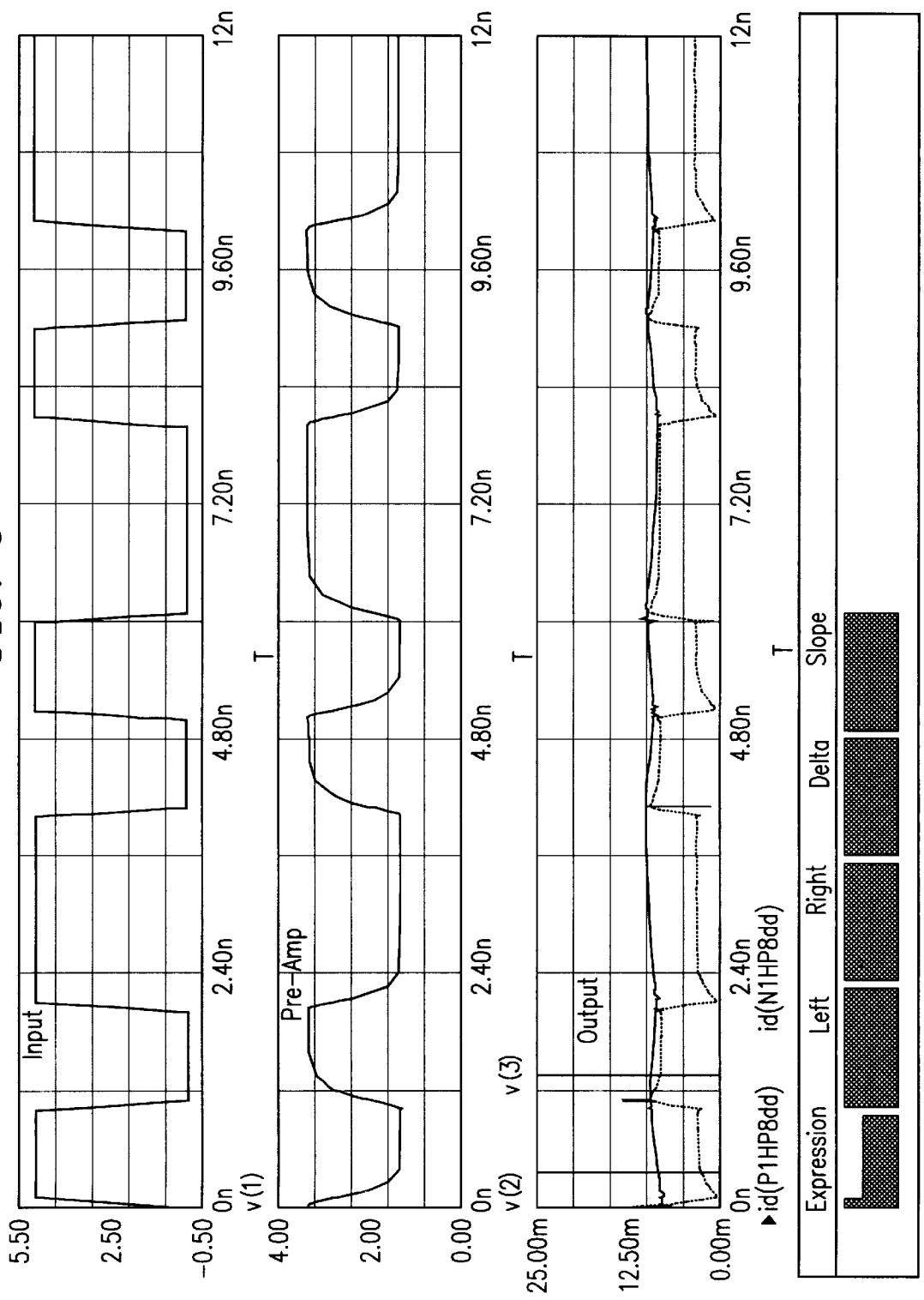
FIG. 3 is a graph showing 1 Gbit/second simulations of the VCSEL driver circuit of FIG. 2.

Data from 1 Gbit/s simulations of my VCSEL driver circuit of FIG. 2 are shown in FIG. 3. Those skilled in the art will of course recognize that width-to-length ratios of the PMOS transistor, and the current flowing the VCSEL may be varied as dictated by a particular application. Alternatively, the current may be adjusted during operation by varying the gate voltage ($V_{tune}$) of the PMOS transistor. Hence my circuit is amenable for use in a feedback loop that may be used to control the emitted light intensity from the VCSEL.

Various additional modifications of this invention will occur to those skilled in the art and all deviations from the specific teachings of this specification that basically rely upon the principles and their equivalents through which the art has been advanced are properly considered within the scope of the invention as described and claimed.

The invention claimed is:

1. A vertical cavity surface emitting laser (VCSEL) driving circuit wherein the VCSEL is flip-chip bonded to a CMOS substrate CHARACTERIZED IN THAT:

the VCSEL is made operational by a high-speed current shunt modulating a current flowing through the VCSEL.

2. The VCSEL driving circuit according to claim 1 wherein the VCSEL is modulated at a rate in excess of 1 Gbit/sec.

3. The VCSEL driving circuit according to claim 1 wherein said high-speed current shunt is an NMOS transistor electrically connected in parallel with the VCSEL.

4. The VCSEL driving circuit according to claim 3 further comprising:
   a PMOS source transistor electrically connected to the VCSEL such that the operational current is supplied to the VCSEL.

5. A vertical cavity surface emitting laser (VCSEL) driver circuit comprising:
   a VCSEL, flip-chip bonded to a substrate;
   a source transistor, electrically connected to the VCSEL such that an operating current is provided to the VCSEL; and
   a shunt transistor, electrically connected to the VCSEL and the source transistor such that the VCSEL operating current is shunted away from the VCSEL through the action of the shunt transistor.

6. The VCSEL driver circuit according to claim 5 wherein the source transistor is a PMOS source transistor under the control of a gate voltage signal, $V_{tune}$ such that when sufficient gate voltage is applied to the source transistor, the VCSEL operating current is provided to the VCSEL.

7. The VCSEL driver circuit according to claim 6 wherein the shunt transistor is an NMOS transistor under the control of a gate voltage signal $V_{in}$ such that when sufficient gate voltage is applied to the shunt transistor, the VCSEL operating current is shunted from the VCSEL thereby modulating the VCSEL power output.

8. A vertical cavity surface emitting laser (VCSEL) driver circuit comprising:
   a VCSEL, flip-chip bonded to a substrate;
   means for providing an operating current to the VCSEL; and
   means for shunting the VCSEL operating current from the VCSEL
   such that the VCSEL operating current is modulated and a power output from the VCSEL is modulated.

9. The VCSEL driver circuit according to claim 8 wherein the operating current providing means is a PMOS transistor electrically connected to a current source and the VCSEL and under the operative control of an applied gate voltage.

10. The VCSEL driver circuit according to claim 9 wherein the current shunting means is an NMOS transistor electrically connected in parallel to the VCSEL and the operating current providing means.

11. In a vertical cavity surface emitting laser (VCSEL) driver circuit comprising:
    a VCSEL, flip-chip bonded to a substrate;
    a source transistor having an input electrically connected to a current source and an output electrically connected to the VCSEL under the control of an applied gate voltage; and
    a shunt transistor under the control of an applied gate voltage and electrically connected in parallel to the VCSEL and the output of the source transistor;
    a method for operating the driver circuit, the method comprising the steps of:
      applying an applied gate voltage to the source transistor such that an operating current is supplied to the VCSEL; and
      applying an applied gate voltage to the shunt transistor such that the operating current is shunted from the VCSEL thereby modulating its output.

* * * * *